US009793924B1

(12) United States Patent
Graumann et al.

(10) Patent No.: US 9,793,924 B1
(45) Date of Patent: Oct. 17, 2017

(54) METHOD AND SYSTEM FOR ESTIMATING AN EXPECTATION OF FORWARD ERROR CORRECTION DECODER CONVERGENCE

(71) Applicant: Microsemi Solutions (U.S.), Inc., Aliso Viejo, CA (US)

(72) Inventors: Peter Graumann, Calgary (CA); Sean G. Gibb, Calgary (CA)

(73) Assignee: Microsemi Solutions (U.S.), Inc., Aliso Viejo, CA (US)

( * ) Notice: Subject to any disclaimer, the term of this patent is extended or adjusted under 35 U.S.C. 154(b) by 9 days.

(21) Appl. No.: 14/960,063

(22) Filed: Dec. 4, 2015

(51) Int. Cl.
H03M 13/00 (2006.01)
H03M 13/11 (2006.01)
G06F 11/10 (2006.01)

(52) U.S. Cl.
CPC ..... H03M 13/1128 (2013.01); G06F 11/1076 (2013.01); H03M 13/1131 (2013.01)

(58) Field of Classification Search
CPC .......... H03M 13/1128; H03M 13/1131; G06F 11/1076
See application file for complete search history.

(56) References Cited

U.S. PATENT DOCUMENTS

| | | | |
|---|---|---|---|
| 8,020,070 B2 | 9/2011 | Langner et al. | |
| 8,196,016 B1 | 6/2012 | Langner et al. | |
| 8,448,039 B2 | 5/2013 | Gunnam | |
| 8,677,225 B1 * | 3/2014 | Weiner | H03M 13/1108 714/800 |
| 8,806,307 B2 | 8/2014 | Alrod et al. | |
| 8,898,537 B2 | 11/2014 | Gross et al. | |
| 2011/0311002 A1 | 12/2011 | Li et al. | |
| 2012/0262814 A1 * | 10/2012 | Li | G11B 20/10046 360/32 |
| 2014/0019825 A1 | 1/2014 | Aliseychik et al. | |
| 2015/0026536 A1 | 1/2015 | Hubris et al. | |
| 2015/0349807 A1 * | 12/2015 | Vernon | H03M 13/353 714/774 |
| 2016/0179620 A1 * | 6/2016 | Bazarsky | H03M 13/116 714/766 |

FOREIGN PATENT DOCUMENTS

WO     2009156883 A1     12/2009

OTHER PUBLICATIONS

U.S. Appl. No. 14/642,072, Notice of Allowance dated Nov. 28, 2016.

* cited by examiner

*Primary Examiner* — Sam Rizk
(74) *Attorney, Agent, or Firm* — Dennis R. Haszko (57) ABSTRACT

A forward error correction decoder and method of decoding a codeword is provided. The decoder comprises a convergence processor for estimating an expectation of codeword convergence. The convergence processor is configured to calculate a first value of a figure of merit; calculate a second value of the figure of merit; combine the second value of the figure of merit and the first value of the figure of merit to produce a progress value; compare the progress value of the decoding to a progress threshold; and increase a maximum number of iterations of the decoder if the progress value is greater than the progress threshold. The maximum number of iterations may be initially set to a low number beneficial for power consumption and raw throughput. Increasing the maximum number of iterations devotes additional resources to a particular codeword and is beneficial for error rate performance.

20 Claims, 9 Drawing Sheets

METHOD AND SYSTEM FOR ESTIMATING AN EXPECTATION OF FORWARD ERROR CORRECTION DECODER CONVERGENCE

FIELD

The present disclosure relates to forward error correction (FEC) decoders.

BACKGROUND

Low Density Parity Code (LDPC) decoders are current generation iterative soft-input forward error correction (FEC) decoders that have found increasing popularity in FEC applications where low error floor and high performance are desired. LDPC decoders are defined in terms of a two-dimensional matrix, referred to as an H matrix, which describes the connections between the data bits and the parity bits of an LDPC code. Thus, the H matrix comprises rows and columns of data and parity information. Decoding an LDPC codeword involves associating the LDPC codeword with the H matrix and solving, based on a two-step iterative method, the equations generated from the association of the LDPC codeword and the H matrix. Soft-decoding the codeword causes convergence of the solved codeword with the true codeword; convergence is achieved over a number of iterations and results in a corrected codeword with no errors.

A category of LDPC codes, known as quasi-cyclic (QC) codes, generates an H matrix with features that improve the ease of implementing the LDPC encoder and decoder. In particular, it is possible to generate a QC-LDPC H matrix where some rows are orthogonal to each other. These orthogonal rows are treated as a layer, and rows within a layer can be processed in parallel, thus reducing the iterative cost of the decoder. Furthermore, a layered LDPC decoder can process a layer by combining the two-step iterations into a single one-step operation. It is advantageous to reduce the number of iterations necessary to decode an LDPC codeword.

Performance of a given FEC decoder may be measured, according to one exemplary metric, by comparing the frame error rate (FER) at the decoder output to the bit error rate (BER) at the decoder input. An input bit error can be, for example, a random bit flip caused by noise between a transmitter and a receiver. An output frame error represents an uncorrectable codeword, which results in a decode failure. Generally, more input bit errors will cause more output frame errors. However, some FEC decoders or decoder configurations can handle a given BER better than other decoders or decoder configurations. Graphing the FER vs. BER relationship in a "waterfall"-like graph can show relative performance of different FEC decoders or decoder configurations.

Figure 1:
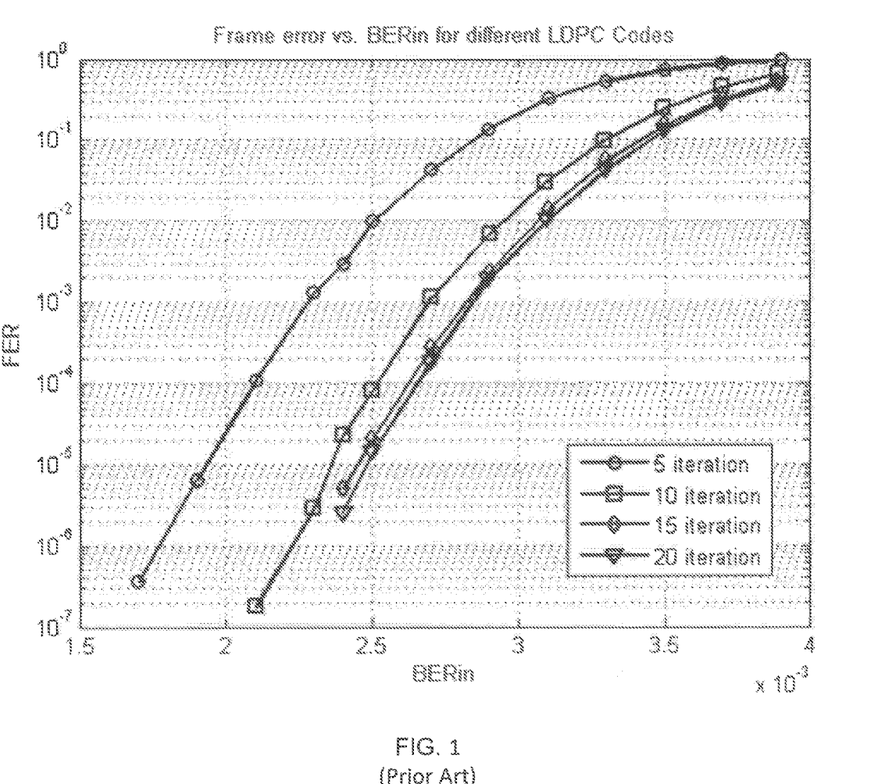
FIG. 1 is a FER performance graph of a conventional FEC decoder.

FIG. 1 is a graph showing an example of FER performance of a conventional layered LDPC decoder. The graph shows the LDPC decoder according to four different configurations: having 5 maximum iterations, 10 maximum iterations, 15 maximum iterations, and 20 maximum iterations. The number of maximum iterations refers to the maximum number of times the decoder will spend on processing the layers of the H matrix before the decoder abandons the decoding. It is not practical to design a decoder without a maximum number iterations limit because the decoder can become stuck decoding an uncorrectable codeword.

When the decoder abandons or terminates decoding before convergence, the decoder effectively declares that the received codeword is uncorrectable. Since the decoder does not achieve convergence, a system relying on the FEC decoder will have to resort to other means to recover the information originally transmitted in the codeword. For example, the system may use communication protocols to cause re-transmission of the codeword. For this reason, it is undesirable for the decoder to fail to achieve convergence of a codeword.

FIG. 1 shows that increasing the maximum number of iterations of the LDPC decoder improves the FER performance, leading to fewer instances where the decoder terminates decoding before codeword convergence. Therefore, by this one measure, it is desirable to increase the maximum number of iterations of the LDPC decoder.

However, it may not always be desirable to increase the maximum number of iterations of the LDPC decoder because frequently running the decoder up to the maximum number of iterations decreases the raw processing throughput of the decoder.

Figure 2:
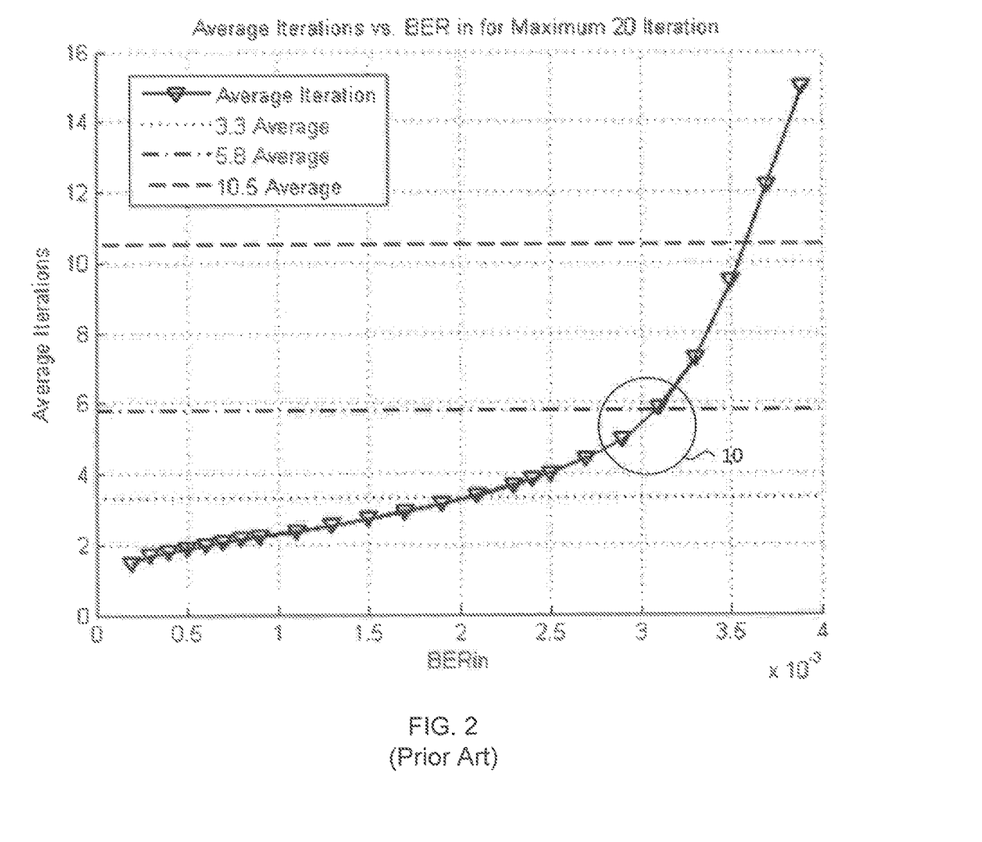
FIG. 2 is an average iterations graph of a conventional FEC decoder.

FIG. 2 is a graph showing an average number of iterations for the LDPC decoder to decode a codeword vs. the input BER of the codeword. The LDPC decoder is configured to 20 maximum iterations. When the BER at the LDPC decoder input increases, the LDPC decoder takes, on average, more time to decode each codeword. This expected trend has a linear slope from approximately $0.2*10^{-3}$ to $3*10^{-3}$ BER. At approximately $3*10^{-3}$ BER, the slope increases significantly; therefore, from approximately $3*10^{-3}$ to $4*10^{-3}$ BER, the performance of the LDPC decoder diminishes more for each increasing BER than in the $0.2*10^{-3}$ to $3*10^{-3}$ BER range.

This change in slope, or "knee", at region 10 in the graph of FIG. 2 indicates the input BER at which many codeword decodes run to the maximum number of iterations. When the average iteration load becomes dominated by decode runs to the maximum number of iterations (e.g. 20 iterations), average iteration value quickly increases, as shown in FIG. 2. Generally, a higher average iteration value corresponds to longer decode times and lower raw throughput at the decoder.

Figure 3:
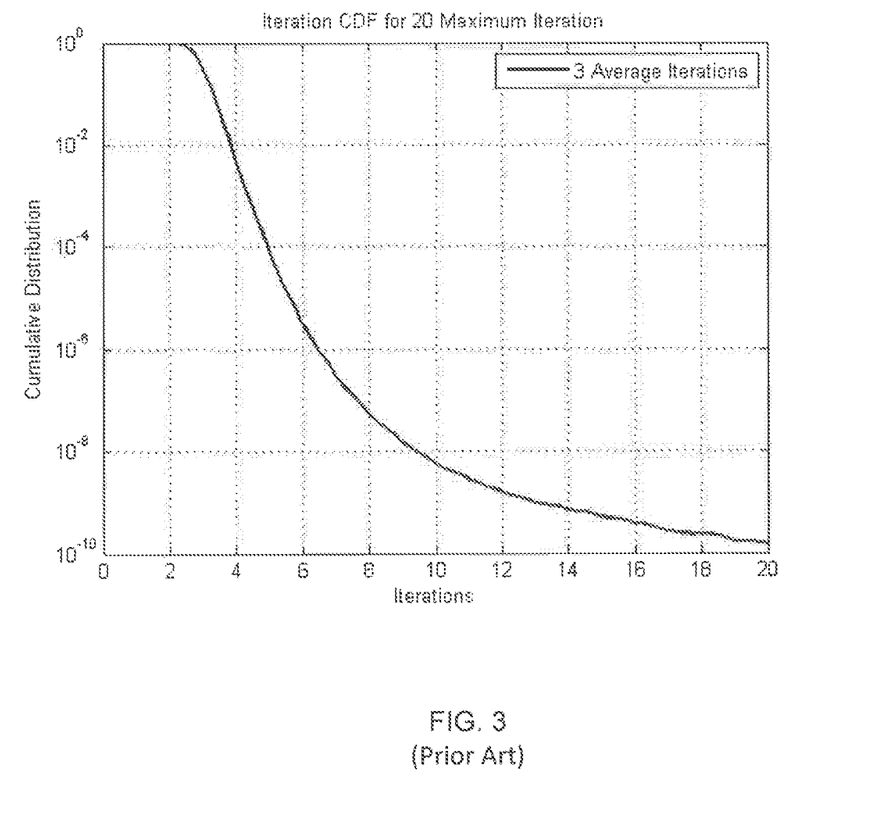
FIG. 3 is a cumulative distribution function graph of a conventional FEC decoder.

More specifically, however, for every average iteration data point in FIG. 2, a cumulative distribution function (CDF) can be graphed to show the probabilities of various iteration values included in the average iteration data point. FIG. 3 is a graph showing the CDF of the 3 average iterations data point for the LDPC decoder configured to 20 maximum iterations.

FIG. 3 shows that the LDPC decoder will take longer than 6 iterations to process a codeword approximately once every 1,000,000 codewords; furthermore, the LDPC decoder will take longer than 9 iterations approximately once every 100,000,000 codewords. Finally, the LDPC decoder will run to the maximum iteration limit (i.e. 20 iterations) approximately once every 10,000,000,000 codewords.

It is clear in FIG. 3 that reducing the maximum number of iterations will change the CDFs of all average iteration data points in FIG. 2. Moreover, reducing the maximum number of iterations will shift the location of the "knee" in FIG. 2, leading to generally lower average iteration counts and lower power consumption. However, as shown in FIG. 1, it is also clear that reducing the maximum number of iterations has a detrimental impact on FER performance, leading to more decode failures.

It is, therefore, desirable to provide an FEC decoder with high FER performance, high raw throughput and low power consumption.

BRIEF DESCRIPTION OF THE DRAWINGS

Embodiments of the present disclosure will now be described, by way of example only, with reference to the attached Figures.

DETAILED DESCRIPTION

Generally, the present disclosure provides a forward error correction (FEC) decoder and method of decoding a FEC codeword. The decoder comprises a convergence processor for estimating an expectation of codeword convergence. The convergence processor calculates a first value of a figure of merit and calculates a second value of the figure of merit. The convergence processor combines the second value of the figure of merit and the first value of the figure of merit to produce a progress value and compares the progress value of the decoding to a progress threshold. The convergence processor will increase a maximum number of iterations of the decoder if the progress value is greater than the progress threshold. The maximum number of iterations may be initially set to a low number beneficial for power consumption and raw throughput. Increasing the maximum number of iterations devotes additional resources to a particular codeword and is beneficial for error rate performance.

Specifically, the convergence processor provides the FEC decoder with high FER performance, high raw throughput and low power consumption.

In an embodiment, the present disclosure provides a forward error correction (FEC) decoder for decoding a FEC codeword, comprising: a main memory for receiving, storing, and outputting the FEC codeword; a decoder processor for iteratively decoding the FEC codeword over multiple processing cycles; and a convergence processor configured to:

update a figure of merit after each processing cycle iteration; calculate a first value of the figure of merit after a first number of decoder iterations; calculate a second value of the figure of merit after a second number of decoder iterations; combine the second value of the figure of merit and the first value of the figure of merit to produce a progress value; compare the progress value of the decoding to a progress threshold; instruct the decoder processor to continue the decoding of the FEC codeword in further iterations if the progress value is greater than the progress threshold; and terminate the decoding of the FEC codeword before the completion of the decoding if the progress value is smaller than the progress threshold.

In a further embodiment, the decoder is a Low Density Parity Check (LDPC) decoder and the FEC codeword is an LDPC codeword and decoding the LDPC codeword comprises associating the LDPC codeword with a plurality of LDPC check nodes and iteratively updating the LDPC codeword according to a belief propagation method based on the plurality of LDPC check nodes.

In a further embodiment, the figure of merit is a count of check node solutions that have even parity, and the first value of the figure of merit is the count of the check node solutions that have even parity after the first number of iterations, and the second value of the figure of merit is the count of check node solutions that have even parity after the second number of iterations.

In a further embodiment, combining the second value of the figure of merit and the first value of the figure of merit comprises subtracting the count of the check node solutions that have even parity after the first number of iterations from the count of check node solutions that have even parity after the second number of iterations.

In a further embodiment, the progress threshold is equal to a difference of at least 2.4% of the total number of check nodes.

In a further embodiment, the second number of iterations is one processing cycle greater than the first number of iterations.

In a further embodiment, the second number of iterations is four processing cycles greater than the first number of iterations.

In a further embodiment, the second number of iterations is equal to 10, 15, or 20 iterations.

In a further embodiment, the convergence processor is further configured to terminate the decoding of the FEC codeword before the completion of the decoding if the decoding reaches a maximum number of iterations.

In a further embodiment, the convergence processor is further configured to terminate the decoding of the FEC codeword after the first number of iterations if the first value of the figure of merit is less than a first iteration threshold.

In another embodiment, the present disclosure provides a method of decoding a forward error correction (FEC) codeword, comprising: receiving the FEC codeword at a main memory; iteratively decoding the FEC codeword over multiple processing cycles at a decoder processor; updating a figure of merit, at a convergence processor, after each processing cycle iteration; calculating a first value of the figure of merit after a first number of decoder iterations; calculating a second value of the figure of merit after a second number of decoder iterations; combining the second value of the figure of merit and the first value of the figure of merit to produce a progress value; comparing the progress value of the decoding to a progress threshold; sending an instruction, from the convergence processor to the decoder processor, to continue the decoding of the FEC codeword in further iterations if the progress value is greater than the progress threshold; and terminating the decoding of the FEC codeword before the completion of the decoding if the progress value is smaller than the progress threshold.

In a further embodiment, the FEC codeword is a Low Density Parity Check (LDPC) codeword and decoding the LDPC codeword comprises associating the LDPC codeword with a plurality of LDPC check nodes and iteratively updating the LDPC codeword according to a belief propagation method based on the plurality of LDPC check nodes.

In a further embodiment, the figure of merit is a count of check node solutions that have even parity, the first value of the figure of merit is the count of the check node solutions that have even parity after the first number of iterations, and the second value of the figure of merit is the count of check node solutions that have even parity after the second number of iterations.

In a further embodiment, combining the second value of the figure of merit and the first value of the figure of merit comprises subtracting the count of the check node solutions that have even parity after the first number of iterations from the count of check node solutions that have even parity after the second number of iterations.

In a further embodiment, the progress threshold is equal to a difference of at least 2.4% of the total number of check nodes.

In a further embodiment, the second number of iterations is one processing cycle greater than the first number of iterations.

In a further embodiment, the second number of iterations is four processing cycles greater than the first number of iterations.

In a further embodiment, the second number of iterations is equal to 10, 15, or 20 iterations.

In a further embodiment, the method comprises terminating the decoding of the FEC codeword before the completion of the decoding if the decoding reaches a maximum number of iterations.

In a further embodiment, the method comprises terminating the decoding of the FEC codeword after the first number of iterations if the first value of the figure of merit is less than a first iteration threshold.

In a further embodiment, the figure of merit is a moving average of check node solutions that have even parity, and the first value of the figure of merit is an average number of check node solutions that have even parity over N iterations after the first number of iterations, and the second value of the figure of merit is an average number of check node solutions that have even parity over N iterations after the second number of iterations.

In a further embodiment, the figure of merit is an exponential moving average of check node solutions that have even parity, and the first value of the figure of merit is a weighted average number of check node solutions that have even parity over N iterations after the first number of iterations, and the second value of the figure of merit is a weighted average number of check node solutions that have even parity over N iterations after the second number of iterations.

In a further embodiment, combining comprises a moving average convergence divergence (MACD) calculation, and the first value of the figure of merit is a moving average of check node solutions that have even parity over N iterations after the first number of iterations, and the second value of the figure of merit is an exponential moving average of check node solutions that have even parity over M iterations after the second number of iterations, wherein M is a positive integer that is smaller than N, and the first number of iterations is equal to the second number of iterations.

In another embodiment, the present disclosure provides a method of configuring a forward error correction (FEC) decoder, comprising: calculating a first value of a figure of merit after a first number of decoder iterations; calculating a second value of the figure of merit after a second number of decoder iterations; combining the second value of the figure of merit and the first value of the figure of merit to produce a progress value; comparing the progress value of the decoding to a progress threshold; and increasing a maximum number of iterations of the decoder if the progress value is greater than the progress threshold.

Other aspects and features of the present disclosure will become apparent to those ordinarily skilled in the art upon review of the following description of specific embodiments in conjunction with the accompanying figures.

Figure 4:
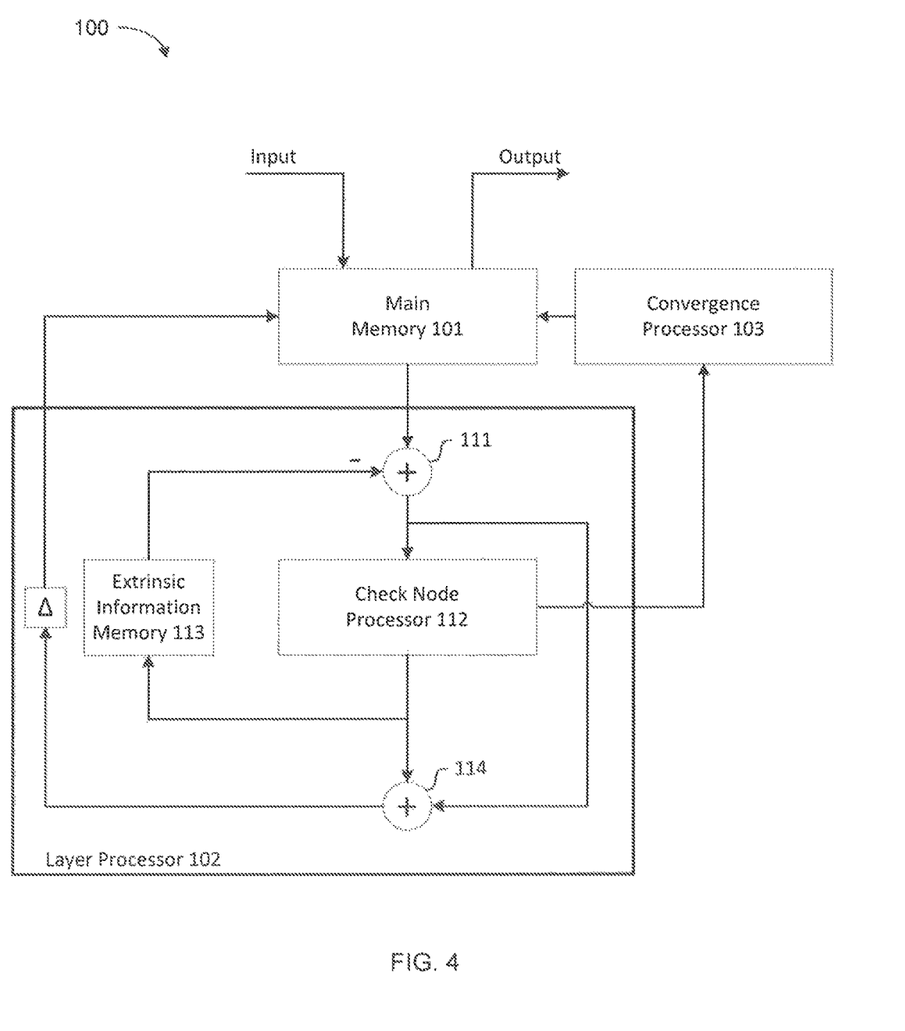
FIG. 4 illustrates an FEC decoder according to an embodiment of the present disclosure.

FIG. 4 illustrates an LDPC decoder 100 according to an embodiment of the present disclosure. The decoder 100 is a layered decoder and generally comprises a main memory 101, a layer processor 102, and a convergence processor 103.

The main memory 101 receives an LDPC codeword from the decoder input, stores the intermediate decoding states of the codeword between each decode iteration, and outputs the completely decoded codeword at the decoder output.

The layer processor 102 receives a set of soft-vales from the main memory 101. Each soft-value represents a binary bit of the codeword; the magnitude and sign of the soft-value indicates a confidence of the bit being either a '0' or a '1'. A portion of the soft-values relates to the data bits of the codeword and another portion relates to the parity bits of the codeword.

LDPC decoding involves associating the set of soft-values with the H matrix to generate a number of parity equations. In particular, the H matrix comprises a number of columns equal to the total number of soft-values (i.e., the sum of the number of data bit soft-values and the number of parity bit soft-values), and comprises a number of rows equal to the number of parity bit soft-values. Therefore, the set of soft-values can be threshold converted to binary bits and multiplied with each row of the H matrix to generate as many parity equations as the number of rows. If the solutions to all of the parity equations are even, then the soft-values represent the correct binary codeword, which is known as convergence.

If a solution to a parity equation is odd, then the soft-values have not converged. The purpose of the layer processor 102 is to update the soft-values, based on a belief propagation method, and to possibly change the confidence of one or more soft-values from a '0' to a '1' or vice-versa. Accordingly, by flipping one or more bits, a solution to one or more parity equations will change, and eventually result in convergence.

The decoder 100 may include more than one layer processor 102, although only one is shown in FIG. 4. When the decoder 100 comprises multiple layer processors, each layer processor can operate on a different row of the H matrix simultaneously; therefore a decoder with multiple layer processors can process multiple rows of one H matrix layer in parallel. If the decoder 100 includes the same number or more parallel layer processors 102 than numbers of rows in a layer, the parallel layer processors 102 may be able to process all of the rows of one H matrix layer in one processing cycle. Generally, the overall processing time of the decoder 100 decreases linearly by increasing the number of parallel layer processors 102 up to and including full parallel operation.

Each layer processor 102 comprises a first adder 111, a check node processor 112, an extrinsic information memory 113, and a second adder 114.

The first adder 111 receives a soft-value from the main memory 101. The soft-value is a summation of channel information and extrinsic information. Channel information refers to the initial soft-value estimated and assigned to the bit of the codeword when the codeword is read from the noisy channel. This initial estimation can be based on analog measurements such as the voltage of the received signal, for example.

Extrinsic information refers to subsequent updates to the soft-value based on other soft-values of the codeword. These updates are generated by the check node processor 112 according to a belief propagation method. Since the soft-value is associated with multiple rows of the H matrix, the soft-value may be updated when each row is processed. Thus, the extrinsic information is derived from all of the different rows of the H matrix. The summation of the initial soft-value (channel information) and the subsequent updates to the soft-value (extrinsic information from processing each of the rows) equals the current soft-value.

The first adder 111 removes the latest extrinsic information related to the row that the layer processor is currently processing. Removing this extrinsic information ensures that the input of the check node processor 112 does not contain any previous information from itself. Since the soft-value includes channel information and extrinsic information from processing each row over multiple iterations, the output of the first adder 111 is equal to the initial soft-value, plus all of the subsequent updates to the initial soft-value, minus the latest update from the row currently being processed.

The check node processor 112 receives this output from the first adder 111 and performs an approximation of the belief propagation method, such as a min-sum method or its alternatives, and outputs extrinsic information representing a new update to the soft-value.

The second adder 114 combines the output of the check node processor 112 (the extrinsic information representing the new update to the soft-value) with the output of the first adder 111 (the channel information and the extrinsic information except for the previous update from the currently processed row). Thus, the soft-value is updated to equal the initial soft-value, plus all of the subsequent updates to the initial soft-value except the previous update from the current row, plus the recent update from the current row. The second adder 114 provides the updated soft-value to the main memory 101 for storage for the next processing iteration.

The extrinsic information memory 113 stores the output of the check node processor 112. Thus, the extrinsic information memory 113 holds all of the extrinsic information updates, including the update for the current row and column (i.e., the latest extrinsic information related to the row that the layer processor is currently processing) and provides the extrinsic information of the current row and column to the input of the first adder 111 so that the first adder can remove the extrinsic information from the soft-value read from the main memory 101, as described above.

The convergence processor 103 tracks the iteration count of the decode process and compares the iteration count to the maximum number of iterations configured for the decoder. The convergence processor 103 is connected to the check node processor 112 and receives a status of each check node of the H matrix. Specifically, the check node processor 112, when processing a check node, will calculate either an even or odd parity result for the check node. This result is transmitted to the convergence processor 103, which, in an embodiment, counts the even results in a figure of merit. The convergence processor 103 will terminate the decoding, via the main memory 101, if the iteration count exceeds the maximum number of iterations. The convergence processor 103 may also increase the maximum number of iterations under certain circumstances. Thus, the convergence processor provides the decoder 100 with a variable maximum number of iterations, which allows the decoder 100 to gain the advantages of both a high maximum number of iterations configuration (better FER performance) and a low maximum number of iterations configuration (better raw throughput and power consumption).

While FIG. 4 shows an embodiment wherein the decoder 100 is configured with a layer processor 102 according to a QC LDPC code, features of the present disclosure are equally applicable to non-layered LDPC decoders and FEC decoders in general, including Turbo decoders. Specifically, the decoder 100 may comprise the main memory 101, the convergence processor 103, and any applicable processor for decoding the chosen FEC codeword stored in the main memory 101. In this case, the convergence processor 103 is connected to the applicable processor of the FEC decoder for receiving updates to the chosen figure of merit. Moreover, various embodiments of the present disclosure may be used with flood-filling decoders and decoding methods for example.

Figure 5:
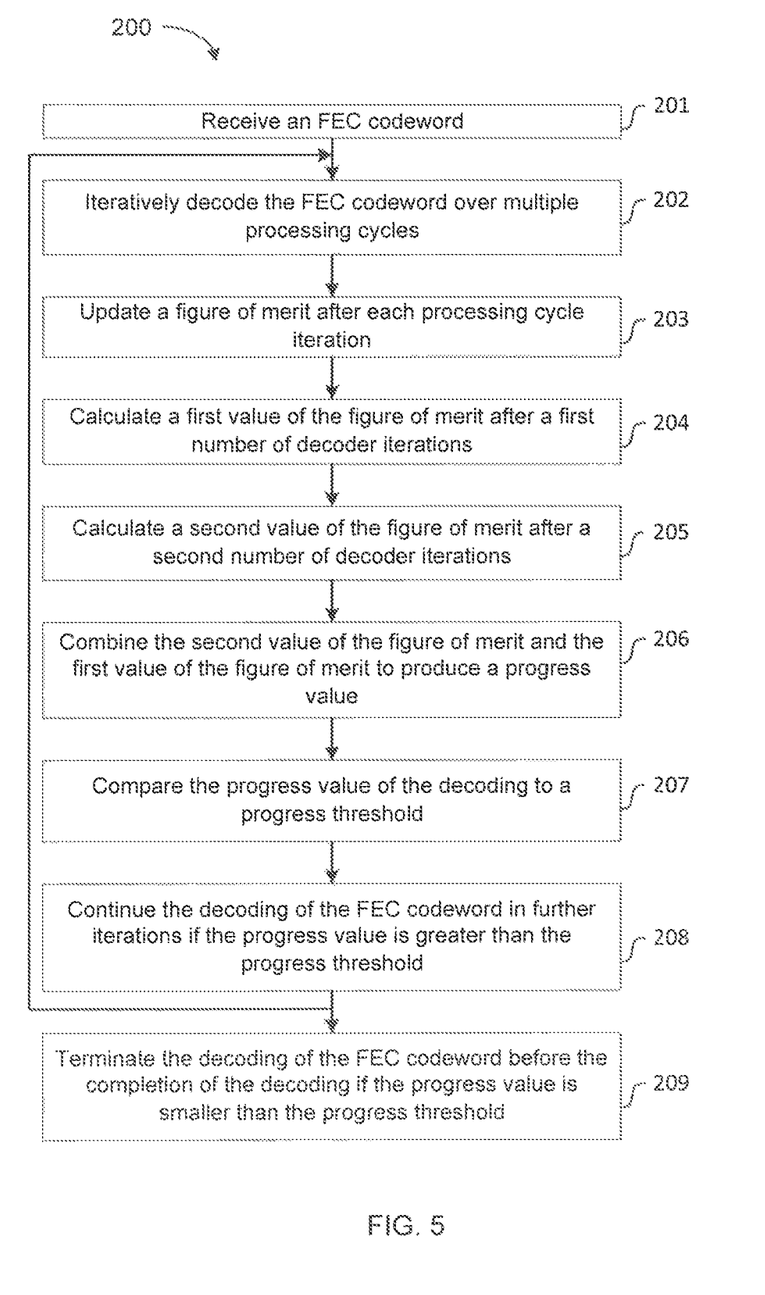
FIG. 5 is a flowchart of a method for operating an FEC decoder according to an embodiment of the present disclosure.

FIG. 5 is a flowchart showing an exemplary method 200 of operating an FEC decoder to provide the decoder with dual advantages of configuring the decoder using both a high maximum number of iterations and a low maximum number of iterations.

At 201, the decoder main memory receives the FEC codeword. At 202, the decoder processor iteratively decodes the LDPC codeword over multiple processing cycles.

At 203 to 207, the convergence processor checks the expected convergence of the FEC codeword stored in the main memory. First at 203, the convergence processor updates a figure of merit after each processing cycle iteration.

In an embodiment, the figure of merit may be a count of the check node solutions that have even parity, a moving average of the number of check node solutions that have even parity over N previous iterations, or a weighted moving average of the number of check node solutions that have even parity over N previous iterations. In another embodiment, the figure of merit may be the average magnitude of the soft values read from memory. Or in yet another embodiment, the figure of merit may be the number of soft values read from memory that exceed a confidence threshold.

At 204, the convergence processor calculates a first value of the figure of merit after a first number of decoder iterations. At 205, the convergence processor calculates a second value of the figure of merit after a second number of decoder iterations.

At 206, the convergence processor combines the second value of the figure of merit and the first value of the figure of merit to produce a progress value. In the example where the figure of merit is the count of the check node solutions that have even parity, combining the second value and first value may comprise subtracting the first value from the second value. In other exemplary figures of merit, such as moving average and exponential moving average, combining may also comprise calculating a difference between the second value and the first value.

In yet further embodiments, the second value and the first value may be based on different figure of merit calculations. For example, combining the second value and the first value may comprise a moving average convergence divergence (MACD) calculation. In the MACD, the first value of the figure of merit is a moving average of check node solutions that have even parity over N iterations after the first number of iterations and the second value of the figure of merit is an exponential moving average of check node solutions that have even parity over M iterations after the second number of iterations. M may be a positive integer that is smaller than N, and the first number of iterations may be equal to the second number of iterations. In another example, combining the second value and the first value may comprise a Bollinger Band calculation.

Next at 207, the convergence processor compares the progress value of the decoding to a progress threshold.

Based on the result of the comparison at 207, the convergence processor proceeds to estimate an expectation of whether the FEC codeword has a high expectation of converging.

If the progress value is greater than the progress threshold, the convergence processor estimates that the FEC codeword has a relatively high expectation of convergence at 208, and continues the decoding of the FEC codeword in further iterations.

If the progress value is less than the progress threshold, the convergence processor estimates that the FEC codeword has a relatively low expectation of convergence at 209, and terminates the decoding of the FEC codeword before the completion of the decoding.

In a further embodiment, the step 208 further comprises the convergence processor determining that the iteration count is equal to the maximum number of iterations and increasing the maximum number of iterations so that the decoder can continue decoding the FEC codeword in further iterations.

Similarly, the step 209 further comprises the convergence processor determining that the iteration count is equal to the maximum number of iterations, deciding not to increase the maximum number of iterations, which leads to terminating the decoding of the FEC codeword before the completion of the decoding.

According to method 200, the maximum number of iterations may be initially set to a relatively low number, which is beneficial for power consumption and raw throughput. When the method 200 determines that it is worthwhile to devote additional resources to decoding a particular FEC codeword, the method can increase the maximum number of iterations, which is beneficial for FER performance.

Figure 6:
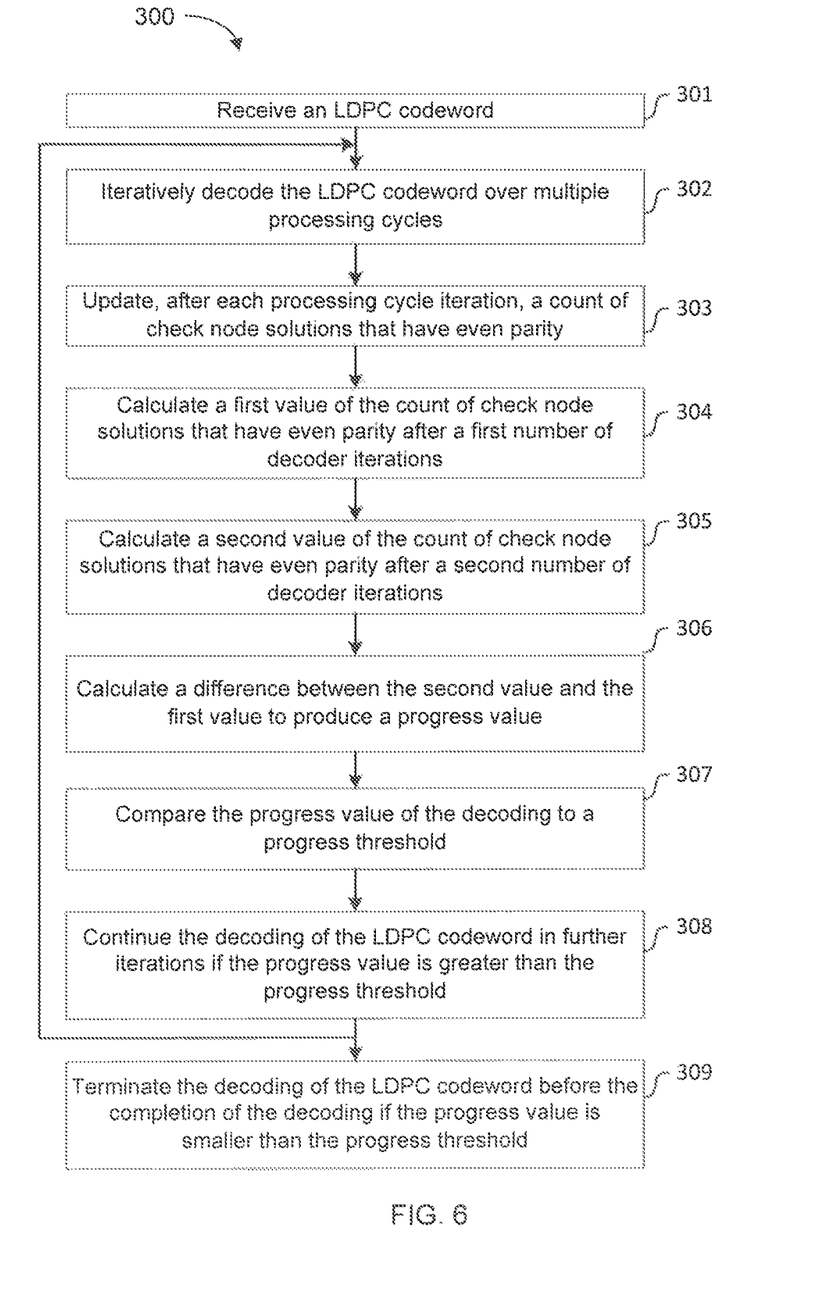
FIG. 6 is a flowchart of a method for operating an LDPC decoder according to an embodiment of the present disclosure.

FIG. 6 is a flowchart showing an exemplary method 300 of operating the convergence processor 103 to provide a layered LDPC decoder 100 with dual advantages of configuring the decoder 100 using both a high maximum number of iterations and a low maximum number of iterations. In this embodiment, the figure of merit is determined by multiplying the LDPC codeword with the H matrix to generate a plurality of parity equation solutions. This is also known as multiplying the LDPC codeword with each row (or check nodes) of the H matrix. The figure of merit is represented by a count of parity equation solutions (or check node solutions) that have even parity.

At 301, the main memory 101 receives the LDPC codeword. At 302, the layer processor 102 iteratively decodes the LDPC codeword over multiple processing cycles.

At 303 to 307, the convergence processor 103 checks the expected convergence of the LDPC codeword stored in the main memory 101. First at 303, the convergence processor updates a count of even parity check node solutions after each processing cycle iteration. In an embodiment, the convergence processor 103 receives an even parity result or an odd parity result from the check node processor 112; if the convergence processor 103 receives an even parity result, the processor 103 increments the count. Otherwise, the processor 103 does nothing.

At 304, the convergence processor 103 calculates a first value of the figure of merit. The first value of the figure of merit is the count of the check node solutions that have even parity after the first number of iterations. At 305, the convergence processor 103 calculates a second value of the figure of merit. The second value of the figure of merit is the count of check node solutions that have even parity after the second number of iterations.

At 306, the convergence processor 103 calculates a difference between the second value and the first value to produce a progress value. The first value may be represented by the value $M(i-D)$ and the second value may be represented by the value $M(i)$.

Therefore, the progress value, $P(i)$, is given by the equation:

$$P(i)=M(i)-M(i-D) \qquad \text{(Equation 1)}$$

where D is the number of iterations between the first number of iterations and the second number of iterations.

In an embodiment, the first number of iterations may be a low number, close to the start of the decoding, such as 1-6 iterations. The second number of iterations is any number larger than the first number, such as 1 or 4 iterations greater than the first number. For example, the first number may be 6 iterations and the second number may be 10 iterations.

Next at 307, the convergence processor 103 compares the progress value of the decoding to a progress threshold. In this example, the check node processor 103 counts the number of even parity check node solutions after 6 and 10 iterations, respectively. The check node processor 103 then determines the difference between the two counts and the compares the difference to a progress threshold, referred to herein as a "convergence envelope."

In an embodiment, the progress threshold is equal to a difference of at least 2.4% of the total number of check nodes. For example, if the H matrix has 2048 rows or check nodes, a good convergence envelope number may be 50, which represent approximately 2.4% of the total number of check nodes.

Based on the result of the comparison at 307, the convergence processor 103 proceeds to estimate an expectation of whether the LDPC codeword has a high expectation of converging.

If the progress value is greater than the progress threshold, the convergence processor 103 estimates that the LDPC codeword has a relatively high expectation of convergence at 308, and continues the decoding of the LDPC codeword in further iterations.

If the progress value is less than the progress threshold, the convergence processor 103 estimates that the LDPC codeword has a relatively low expectation of convergence at 309, and terminates the decoding of the LDPC codeword before the completion of the decoding.

In a further embodiment, the step 308 further comprises the convergence processor 103 determining that the iteration count is equal to the maximum number of iterations and increasing the maximum number of iterations so that the decoder 100 can continue decoding the LDPC codeword in further iterations.

Similarly, the step 309 further comprises the convergence processor 103 determining that the iteration count is equal to the maximum number of iterations, deciding not to increase the maximum number of iterations, which leads to terminating the decoding of the LDPC codeword before the completion of the decoding.

For example, assume the check node processor 103 has set 10 maximum iterations. The check node processor 103 identifies M(6)=1520 even parity check node solutions and M(10)=1565 even parity check node solutions. Since the progress value, P(10)=45, is smaller than the convergence envelope value of 50, the check node processor 103 estimates that the LDPC codeword has a poor expected chance of converging to the correct solution, and decides not to increase the maximum number of iterations. Consequently, the decoder 100 terminates the decoding after the 10 iterations and signals a decode failure. The decoder 100 is now free to process a next LDPC codeword in the queue.

Alternatively, if the check node processor 103 had identified M(10)=1575 even parity check node solutions, the progress value, P(10)=55, would be greater than the convergence envelope value of 50. In this case, the check node processor 103 estimates that the LDPC codeword has a high expected chance of converging to the correct solution, and decides to dedicate additional resources to decoding the LDPC codeword. By increasing the maximum number of iterations to 15 or 20 for example, the decoder 100 will continue iteratively decoding the LDPC codeword, which will likely result in convergence.

In yet a further embodiment, the convergence processor 103 also performs a secondary check of a separate first iteration threshold. It is sometimes useful to check the count of even parity check node solutions immediately after the first iteration. If an LDPC codeword is so badly corrupted that the decoder 100 has virtually no likelihood of converging the codeword, then the codeword will generate a low count of even parity check node solutions after the first iteration, thus failing the first iteration threshold. The first iteration threshold is particularly useful in cases where the starting conditions of a decode operation are highly variable such as in wireless communications links or decoding applications applied to storage media. For example, the first iteration threshold may be 1200 even parity check nodes solutions.

According to method 300, the maximum number of iterations may be initially set to a relatively low number, which is beneficial for power consumption and raw throughput. When the method 300 determines that it is worthwhile to devote additional resources to a particular codeword, the method can increase the maximum number of iterations, which is beneficial for FER performance.

Figure 7:
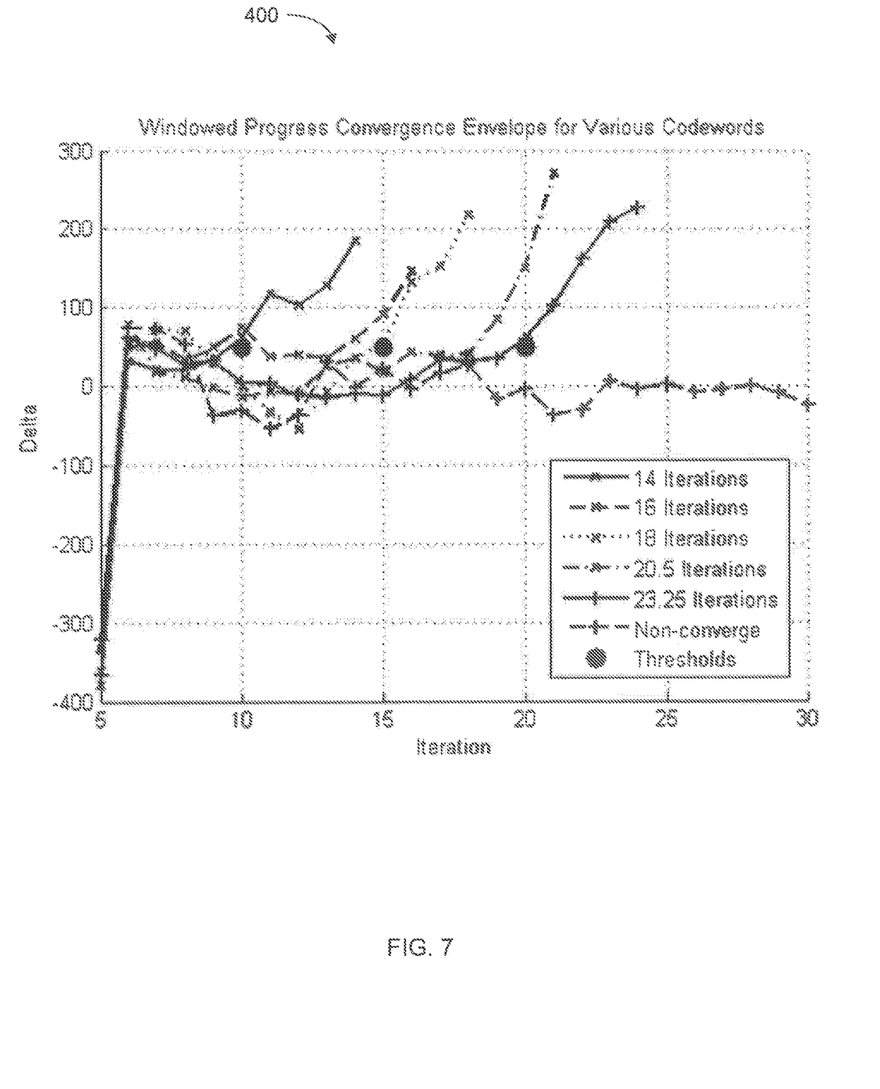
FIG. 7 a graph of a differential progress for various codewords over a number of iterations.

FIG. 7 is a graph 400 of a differential progress for various example LDPC codewords over a number of iterations. The vertical axis shows the progress value, P(i), at a given iteration number. The different lines on the graph represent unique LDPC codewords and show how many iterations it took for the decoder to converge each codeword (e.g. 14, 16, 18, 20.5, and 23.25 iterations).

The graph also shows three progress threshold instances, at 10 iterations, 15 iterations, and 20 iterations. These instances correspond to the second number of iterations value, described above. For each instance, the progress threshold value is 50. For example, at 10 iterations, two LDPC codewords exceed the progress threshold value. If the second number of iterations is set to 10, then these two codewords would be allowed to continue decoding and the codewords would converge at 14 and 16 iterations, respectively. The remaining codewords would be terminated early.

Alternatively, if the second number of iterations is set to 15, an additional codeword would converge at 18 iterations. Further, if the second number of iterations is set to 20, two additional codewords would converge at 20.5 and 23.25 iterations. Each of these thresholds would eventually terminate the non-converging codeword.

Thus, FIG. 7 shows how the second iteration number variable may be used to configure the decoder 100 for selectively terminating decoding of certain codewords, while allowing other more promising codewords to continue decoding until convergence.

Other possible variables for configuring the decoder 100 include the progress threshold (or convergence envelope) threshold value. In the examples above, the value is 50 even parity check node solutions (out of 2048 check nodes), but the value may be different depending on the specific application of the decoder 100.

Another possible variable is the difference between the first number of iterations and the second number of iterations. The difference could be 1, meaning the progress value is taken after each iteration. Or, if the difference is 4, the progress value is taken after every 4 iterations.

Another possible variable is the increased maximum number of iterations. For example, 10 maximum iterations may be increased to 15 or 20 maximum iterations. Furthermore, the convergence processor 103 may be configured to increase the maximum number of iterations more than once. Thus, the 10 maximum iterations may be increased to 15 maximum iterations, and subsequently increased to 20 maximum iterations.

Figure 8:
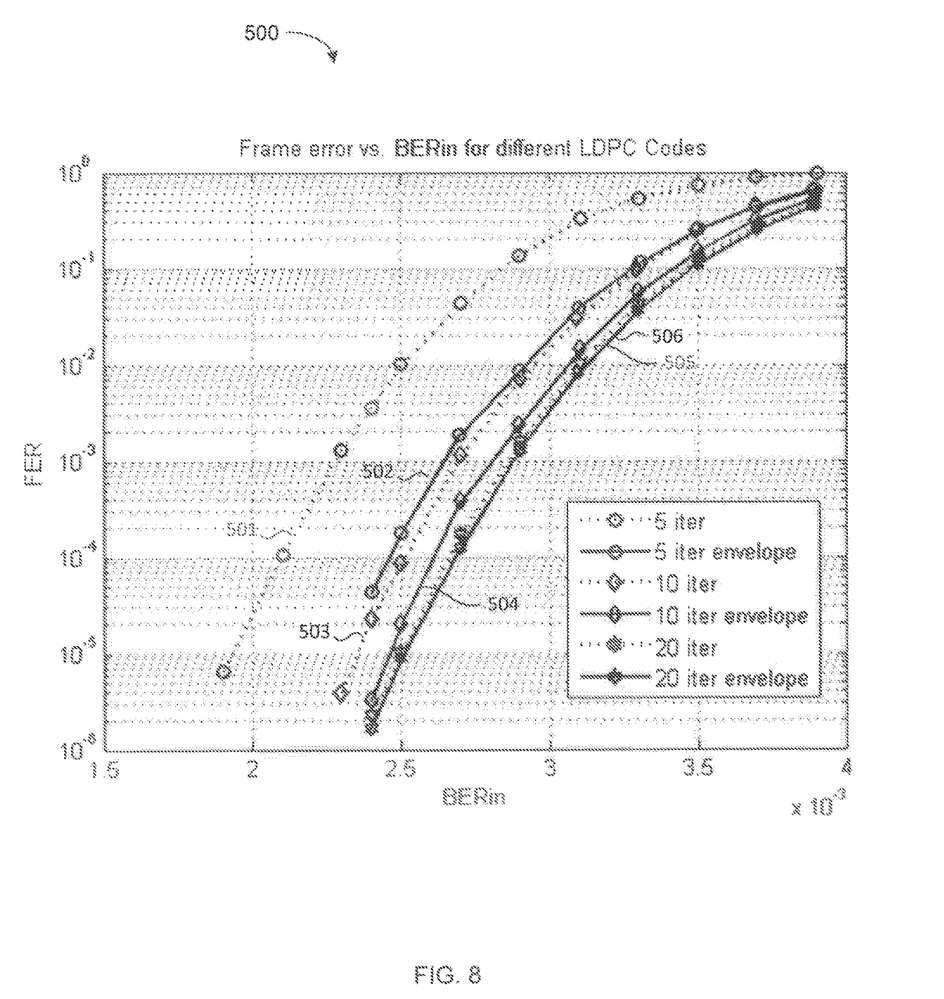
FIG. 8 is FER performance graph of various decoder configurations according to embodiments of the present disclosure.

FIG. 8 is a FER performance graph of various decoder configurations. The graph 500 shows: a line 501 for a conventional decoder configured to 5 maximum iterations; a line 502 for a decoder comprising the convergence processor 103 and configured to 5 maximum iterations; a line 503 for a conventional decoder configured to 10 maximum iterations; a line 504 for a decoder comprising the convergence processor 103 and configured to 10 maximum iterations; a line 505 for a conventional decoder configured to 20 maximum iterations; and a line 506 for a decoder comprising the convergence processor 103 and configured to 20 maximum iterations. In each of 502, 504, and 506, the convergence processor 103 increases the maximum number of iterations an additional 5 iterations over the configured maximum.

The graph of FIG. 8 shows that at the 5 maximum iterations configuration, the convergence processor 103 increases the FER performance significantly from 501 to 502. At the 10 maximum iterations configuration, the convergence processor 103 increases the FER performance to a lesser degree from 503 to 504. At the 20 maximum iterations configuration, however, the convergence processor 103 increases the FER performance an even smaller margin from 505 to 506. This relationship may be explained by the fact that very few codewords take longer than 20 iterations to converge; therefore, there is only a small performance gain when the convergence processor 103 increases the maximum number of iterations beyond 20. Conversely, a larger number of codewords will take longer than 5 iterations to converge; therefore, more gains can be realized when using the convergence processor 103 with an initially low maximum number of iterations configuration, such as 5.

Figure 9:
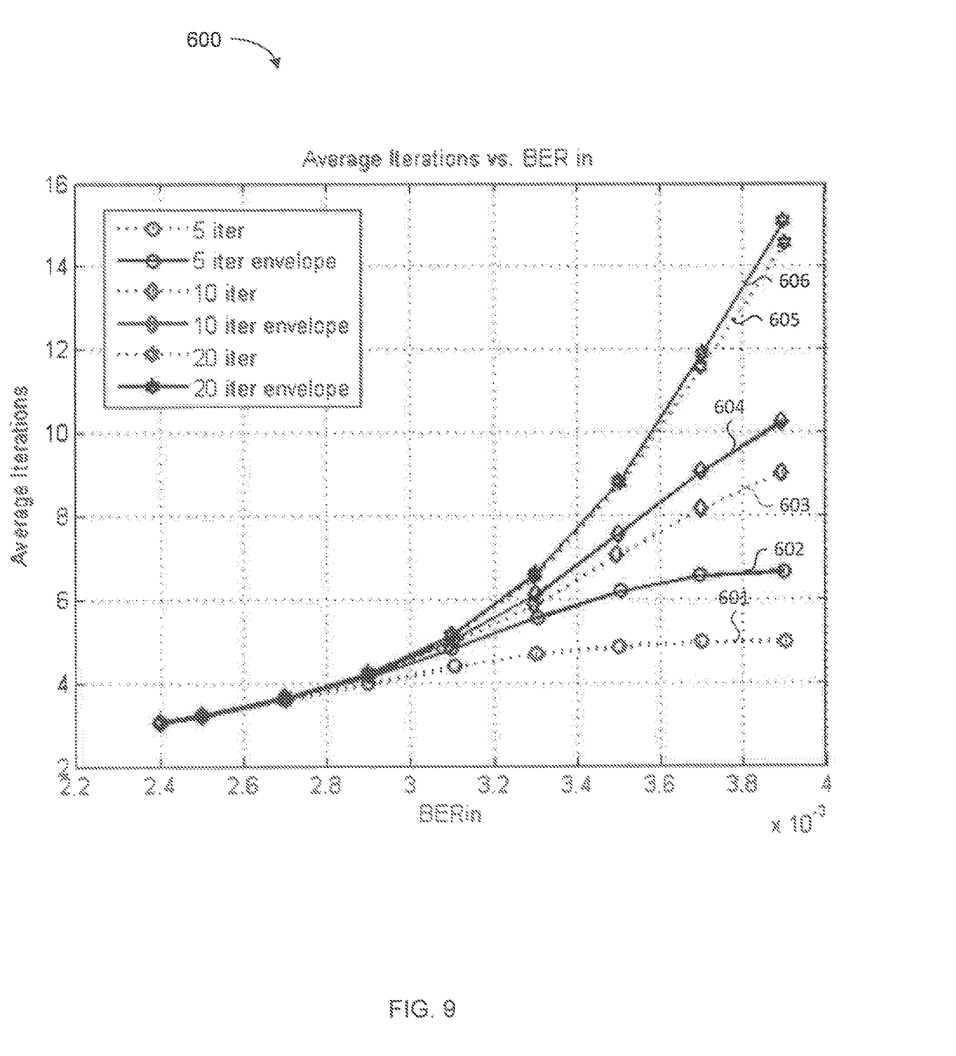
FIG. 9 is a graph of average iterations of various decoder configurations according to embodiments of the present disclosure.

FIG. 9 is graph 600 showing the average number of iterations necessary to converge codewords of a given input BER. The lines 601-606 on the graph 600 represent the corresponding decoder configurations from lines 501-506 from FIG. 8.

FIG. 8 shows that a decoder using the 5 maximum iterations configuration with the convergence processor 103 (line 502) allows the decoder 100 to achieve FER performance similar to a decoder using the 10 maximum iterations configuration without the convergence processor 103 (line 503). Since the use of the convergence processor 103 allows the maximum number of iterations to vary above 5, the decoder can achieve increased FER performance.

FIG. 9 shows that using the convergence processor 103 with the 5 maximum iterations configuration causes the average iteration value to rise to approximately 7 iterations at line 602. Yet the 10 maximum iterations configuration (without the convergence processor 103) causes the average iteration value of the decoder to rise to 9 iterations at line 603. Therefore, FIGS. 8 and 9 show that embodiments of the present disclosure provide FER performance similar to a less efficient decoder or decoder configuration (comparing lines 502 and 503), at lower average iteration values (comparing lines 602 and 603).

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. A forward error correction (FEC) decoder for decoding a FEC codeword, comprising:
    a main memory for receiving, storing, and outputting the FEC codeword;
    a decoder processor for iteratively decoding the FEC codeword over multiple processing cycles; and
    a convergence processor configured to:
        update a figure of merit after each processing cycle iteration;
        calculate a first value of the figure of merit after a first number of decoder iterations;
        calculate a second value of the figure of merit after a second number of decoder iterations, the second number of iterations being different than the first number of decoder iterations;
        combine the second value of the figure of merit and the first value of the figure of merit to produce a progress value;
        compare the progress value of the decoding to a progress threshold;
        instruct the decoder processor to continue the decoding of the FEC codeword in further iterations if the progress value is greater than the progress threshold; and
        terminate the decoding of the FEC codeword before the completion of the decoding if the progress value is smaller than the progress threshold.

2. The decoder of claim 1, wherein the decoder is a Low Density Parity Check (LDPC) decoder and the FEC codeword is an LDPC codeword and decoding the LDPC codeword comprises associating the LDPC codeword with a plurality of LDPC check nodes and iteratively updating the LDPC codeword according to a belief propagation method based on the plurality of LDPC check nodes.

3. The decoder of claim 2, wherein the figure of merit is a count of check node solutions that have even parity, and the first value of the figure of merit is the count of the check node solutions that have even parity after the first number of iterations, and the second value of the figure of merit is the count of check node solutions that have even parity after the second number of iterations.

4. The decoder of claim 3, wherein combining the second value of the figure of merit and the first value of the figure of merit comprises subtracting the count of the check node solutions that have even parity after the first number of iterations from the count of the check node solutions that have even parity after the second number of iterations.

5. The decoder of claim 4, wherein the progress threshold is equal to a difference of at least 2.4% of the total number of check nodes.

6. The decoder of claim 2, wherein the figure of merit is a moving average of check node solutions that have even parity, and the first value of the figure of merit is an average number of check node solutions that have even parity over N iterations after the first number of iterations, and the second value of the figure of merit is an average number of check node solutions that have even parity over N iterations after the second number of iterations.

7. The decoder of claim 2, wherein the figure of merit is an exponential moving average of check node solutions that have even parity, and the first value of the figure of merit is a weighted average number of check node solutions that have even parity over N iterations after the first number of iterations, and the second value of the figure of merit is a weighted average number of check node solutions that have even parity over N iterations after the second number of iterations.

8. The decoder of claim 1, wherein the convergence processor is further configured to terminate the decoding of the FEC codeword before the completion of the decoding if the decoding reaches a maximum number of iterations.

9. The decoder of claim 1, wherein the convergence processor is further configured to terminate the decoding of the FEC codeword after the first number of iterations if the first value of the figure of merit is less than a first iteration threshold.

10. A method of decoding a forward error correction (FEC) codeword, comprising:
    receiving the FEC codeword at a main memory;
    iteratively decoding the FEC codeword over multiple processing cycles at a decoder processor;

updating a figure of merit, at a convergence processor, after each processing cycle iteration;

calculating a first value of the figure of merit after a first number of decoder iterations;

calculating a second value of the figure of merit after a second number of decoder iterations, the second number of iterations being different than the first number of decoder iterations;

combining the second value of the figure of merit and the first value of the figure of merit to produce a progress value;

comparing the progress value of the decoding to a progress threshold;

sending an instruction, from the convergence processor to the decoder processor, to continue the decoding of the FEC codeword in further iterations if the progress value is greater than the progress threshold; and terminating the decoding of the FEC codeword before the completion of the decoding if the progress value is smaller than the progress threshold.

11. The method of claim 10, wherein the FEC codeword is a Low Density Parity Check (LDPC) codeword and decoding the LDPC codeword comprises associating the LDPC codeword with a plurality of LDPC check nodes and iteratively updating the LDPC codeword according to a belief propagation method based on the plurality of LDPC check nodes.

12. The method of claim 11, wherein the figure of merit is a count of check node solutions that have even parity, the first value of the figure of merit is the count of the check node solutions that have even parity after the first number of iterations, and the second value of the figure of merit is the count of check node solutions that have even parity after the second number of iterations.

13. The method of claim 12, wherein combining the second value of the figure of merit and the first value of the figure of merit comprises subtracting the count of the check node solutions that have even parity after the first number of iterations from the count of check node solutions that have even parity after the second number of iterations.

14. The method of claim 12, wherein the progress threshold is equal to a difference of at least 2.4% of the total number of check nodes.

15. The method of claim 11, wherein the figure of merit is a moving average of check node solutions that have even parity, and the first value of the figure of merit is an average number of check node solutions that have even parity over N iterations after the first number of iterations, and the second value of the figure of merit is an average number of check node solutions that have even parity over N iterations after the second number of iterations.

16. The method of claim 11, wherein the figure of merit is an exponential moving average of check node solutions that have even parity, and the first value of the figure of merit is a weighted average number of check node solutions that have even parity over N iterations after the first number of iterations, and the second value of the figure of merit is a weighted average number of check node solutions that have even parity over N iterations after the second number of iterations.

17. The method of claim 11, wherein combining comprises a moving average convergence divergence (MACD) calculation, and the first value of the figure of merit is a moving average of check node solutions that have even parity over N iterations after the first number of iterations, and the second value of the figure of merit is an exponential moving average of check node solutions that have even parity over M iterations after the second number of iterations, wherein M is a positive integer that is smaller than N, and the first number of iterations is equal to the second number of iterations.

18. The method of claim 10, further comprising terminating the decoding of the FEC codeword before the completion of the decoding if the decoding reaches a maximum number of iterations.

19. The method of claim 10, further comprising terminating the decoding of the FEC codeword after the first number of iterations if the first value of the figure of merit is less than a first iteration threshold.

20. A method of configuring a forward error correction (FEC) decoder, comprising:

calculating a first value of a figure of merit after a first number of decoder iterations;

calculating a second value of the figure of merit after a second number of decoder iterations;

combining the second value of the figure of merit and the first value of the figure of merit to produce a progress value;

comparing the progress value of the decoding to a progress threshold; and increasing a maximum number of iterations of the decoder if the progress value is greater than the progress threshold.

* * * * *